United States Patent
Chen et al.

(10) Patent No.: US 6,347,175 B1
(45) Date of Patent: Feb. 12, 2002

(54) SOLDERABLE THIN FILM

(75) Inventors: Gang Chen, Horseheads; Lyle David Kinney, Bath; Emmanuel C Onyiriuka, Painted Post; Mike Xu Ouyang; Laura Weller-Brophy, both of Corning, all of NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/354,361

(22) Filed: Jul. 14, 1999

(51) Int. Cl.$^7$ .............................. G02B 6/02; G02B 6/36
(52) U.S. Cl. ........................................... 385/128; 80/88
(58) Field of Search ............................ 385/128, 88, 92, 385/94, 37, 80; 136/265; 204/298.13

(56) References Cited

U.S. PATENT DOCUMENTS

| | | |
|---|---|---|
| 3,141,238 A | 7/1964 | Harman, Jr. |
| 3,601,889 A | 8/1971 | Kaneoya et al. |
| 3,851,223 A | 11/1974 | Yonezuka et al. |
| 3,904,461 A | 9/1975 | Estep et al. |
| 3,977,840 A | 8/1976 | Estep et al. |
| 4,077,854 A | 3/1978 | Estep et al. |
| 4,108,751 A | 8/1978 | King |
| 4,239,534 A | 12/1980 | Taketoshi |
| 4,303,480 A | 12/1981 | Wood et al. |
| 4,372,809 A | 2/1983 | Grewal et al. |
| 4,385,976 A | 5/1983 | Schuster-Wolden et al. |
| 4,398,975 A | 8/1983 | Ohsawa et al. |
| 4,435,611 A | 3/1984 | Ohsawa et al. |
| 4,742,325 A | 5/1988 | Müller et al. |
| 4,915,745 A * | 4/1990 | Pollack et al. ............... 136/265 |
| 5,120,498 A | 6/1992 | Cocks |
| 5,225,157 A | 7/1993 | McKay |
| 5,415,944 A | 5/1995 | Kazem-Goudarzi et al. |
| 5,500,996 A | 3/1996 | Fritsch et al. |
| 5,645,937 A * | 7/1997 | Noda et al. .................. 428/408 |
| 6,047,876 A * | 4/2000 | Smith ....................... 228/111.5 |
| 6,092,669 A * | 7/2000 | Kushiya et al. ........ 204/298.13 |

OTHER PUBLICATIONS

E. R. Winkle et al, "Integrated Circuit Packaging Trends," *Solid State Technology*, Jun. 1982, pp. 94–100.
P. Harold, "Surface–Mount Design Requires Production Know–How," *END*, Dec. 26, 1985, pp. 110–116.
G. L. Gisberg, "Chip and Wire Technology, the Ultimate in Surface Mounting," *Electronic Packaging and Production*, Aug., 1985, pp. 78–93.
G. L. Gisburg, "Chip–on–Board Profits from TAB and Flip–Chip Technology," *Electronic Pakaging and Production*, Sep., 1985, pp. 140–143.

* cited by examiner

Primary Examiner—Frank G. Font
Assistant Examiner—Amanda Merlino
(74) Attorney, Agent, or Firm—Price, Heneveld, Cooper, DeWitt & Litton

(57) ABSTRACT

A copper-gallium alloy is deposited on a nonconductive substrate, such as glass, ceramic, or polymeric material, to provide a conductor to which solder will readily adhere, such that electrical contacts to photonic and electrical components can be made. The copper-gallium thin film can also be used to provide a surface for solder sealing a component within a hermetically sealed enclosure. In a preferred embodiment, the copper-gallium alloy was from about 1 to about 40 percent gallium to about 99 to about 60 percent copper and was deposited to a thickness of from about 400 nanometers to about 3 microns. The copper-gallium film is deposited utilizing sputtering or electron beam deposition equipment.

18 Claims, 5 Drawing Sheets

Cu/1737: $R_{max}$ = 92.9 nm
$R_{ave}$ = 13.8 nm

CuGa/1737: $R_{max}$ = 16.9 nm
$R_{ave}$ = 2.4 nm

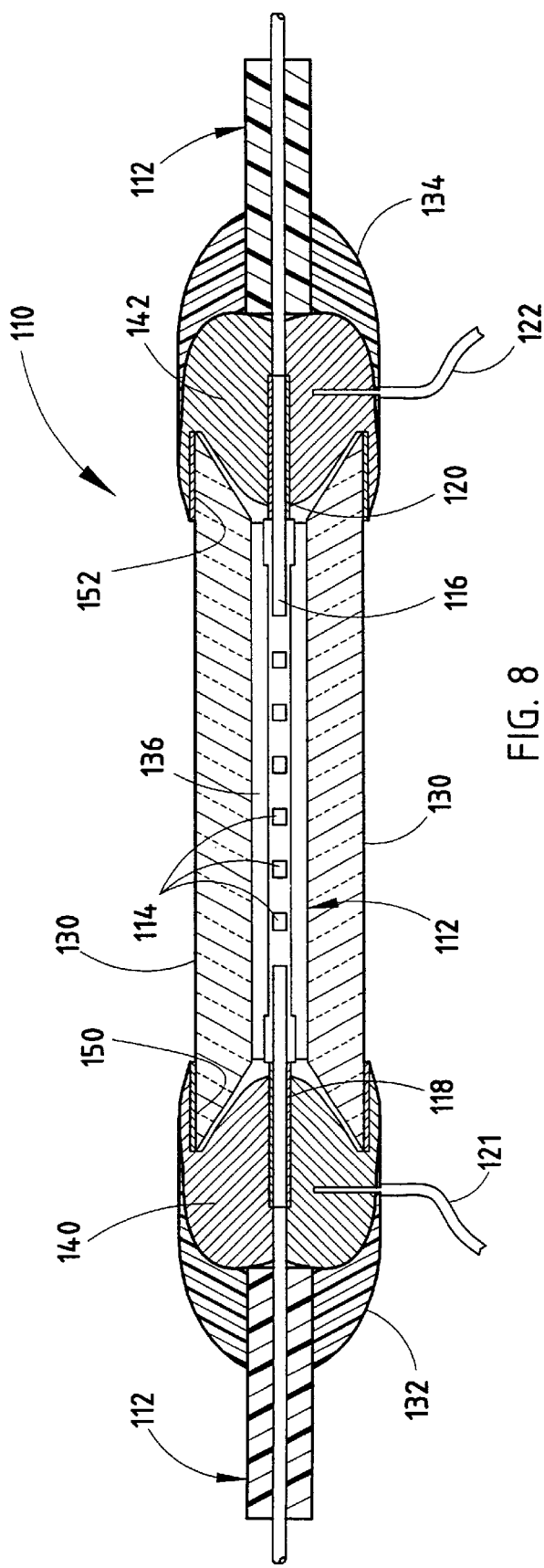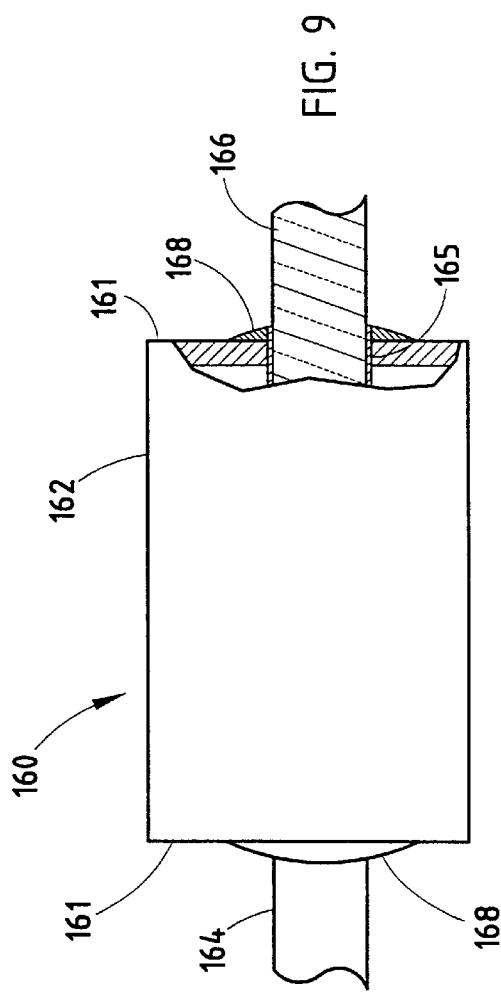

SOLDERABLE THIN FILM

BACKGROUND OF THE INVENTION

1. Field of the Invention

The present invention relates to thin films an d particularly to a thin film which adheres directly to glass, ceramic, and other substrates and which has excellent wettability for solder.

2. Technical Background

Solderable thin films are employed in a variety of electrical components including photonic devices, optical fiber packaging, semi-conductor devices and flat panel displays. Typically, Multiple layers of films are employed, such as indium tin oxide (ITO), which has good adhesion to substrates such as silicone dioxide, aluminum oxide, and other ceramic materials. Such materials, which adhere well to glass and ceramic substrates, typically do not bond well with solder for providing electrical connections to such films. As a result, films such as ITO films must be covered with an outer solderable layer, such as copper, silver, gold, or platinum, so that electrical contacts can be made between devices mounted on a glass or ceramic substrate and external components.

Although copper and gold films are wettable to solder, they have poor adhesion to glass substrates. Silver film has reasonable adhesion and excellent solder wetting properties but suffers from electro-migration and, therefore, reliability. Aluminum and chromium films also adhere well to glass substrates but are not wettable to tin-lead solders. Thus, in the past, multi-layered coatings have been employed with a first layer having excellent adhesion properties deposited onto a substrate followed by one or more over layers of material with the last layer having excellent wettability to solder. Depositing such multiple film layers required heating at temperatures of from about 150° C. to 250° C. to assure adhesion. When, however, heating a substrate during such thin film coating, some devices can be destroyed or their properties adversely affected.

Another difficulty with some thin films results from the fact that the internal strain energy of a film is proportional to its thickness. In thicker multi-layer films, internal strain energy may exceed the adhesion to the film substrate causing a failure of the component using such a film. Also, multi-layer solderable coatings may have a relatively high contact resistance. Typically, adhesion enhancing layers, such as ITO, zinc oxide, and tin oxide, or highly resistive metal layers, such as chrome, Nichrome® and the like, have relatively poor conductivity and cannot achieve a good ohmic contact with the wettable over-layer of copper, gold, or other wettable material.

There exists, therefore, a need for a thin film coating which can be applied at a relatively low temperature, which has a low internal stress when applied, strong adhesion to a variety of substrates and excellent wetting properties for solders employed, such as tin-lead, and gold-tin, and a coating which is environmentally stable.

SUMMARY OF THE INVENTION

It has been discovered that an alloy of copper and gallium provides an excellent thin film material which adheres well to a variety of nonconductive substrates, such as glass, ceramic, and polymeric materials, and which can be applied at a relatively low temperature with minimal internal stress, such that the adhesion to the substrate resists displacement of the thin film from the substrate. Additionally, a copper-gallium alloy provides excellent wettability to solders such that electrical contacts to photonic and electrical components can be made. In a preferred embodiment of the invention, the copper-gallium alloy was from about 1 to about 40 percent gallium and from about 99 to about 60 percent copper on an atomic basis (i.e., percentage of atoms in the alloy) and was deposited to a thickness of from about 400 nanometers to about 3 microns at relatively low temperatures from about room temperature (20° C.). In some applications, it may be desirable to deposit the coating at higher temperatures. The copper-gallium alloy can be deposited over a range of about 20° C. to about 300° C., if desired. The copper-gallium film is deposited utilizing conventional sputtering, electron beam, or other deposition equipment. The resulting thin film can be used, in addition to providing electrical contacts for photonic and electrical components, to provide a surface for solder sealing a component within a hermetically sealed container, frequently used with optical components in telecommunications.

The present invention, therefore, contemplates a method of depositing a copper-gallium alloy on an insulative substrate to provide a thin film layer. The invention further includes pholonic and electrical components which utilize a copper-gallium thin film layer on an insulative substrate for providing electrical contacts for receiving soldered connections. The present invention further contemplates the utilization of copper-gallium thin film on substrates for packaging components by sealing such components utilizing a solder interface as the seal and a combination of sealing and providing electrical contacts.

It is to be understood that the foregoing descriptions are exemplary of the invention only and are intended to provide an overview for the understanding of the nature and character of the invention as it is defined by the claims. The accompanying drawings are included to provided a further understanding of the invention and are incorporated and constitute part of this specification. The drawings illustrate various features and embodiments of the invention which, together with their description serve to explain the principals and operation of the invention.

BRIEF DESCRIPTION OF THE DRAWINGS

FIG. 8 is an enlarged, vertical, cross-sectional view of a tunable fiber Bragg grating embodying the copper-gallium thin film material for both providing an electrical contact for the device and for solder sealing of the package for the device; and FIG. 9 is a side elevational view, partly broken away, of a sealed fiber optic package employing the structure and method of the present invention.

DETAILED DESCRIPTION OF THE PREFERRED EMBODIMENT

Figure 1:
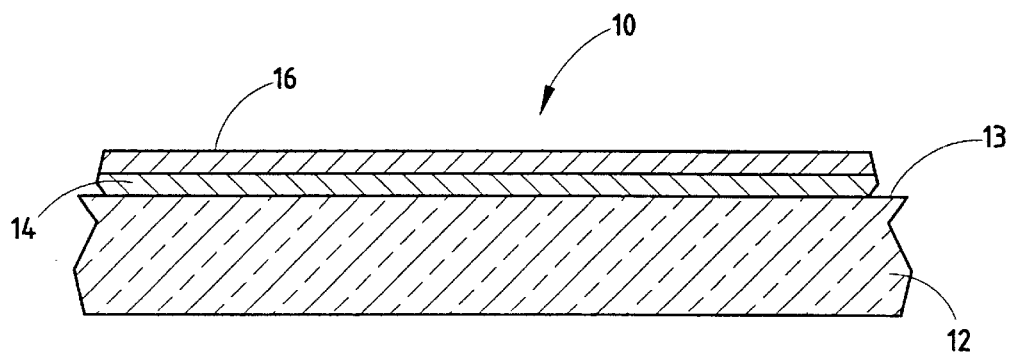
FIG. 1 is an enlarged, fragmentary, schematic view of prior art multi-layer thin film technology.

Referring initially to FIG. 1, there is shown a typical multi-layer thin film system for a device 10 such as a printed circuit, an LCD display, or an optical component having a non-conductive substrate 12 which can be, for example, silicone dioxide, aluminum oxide or any other typically employed ceramic, glass, or polymeric material. Deposited on the upper surface 13 of substrate 12 is a first coating 14 of a material with good bonding ability to the substrate surface 13. Coating 14 may be one or more layers of conventionally employed, vacuum-deposited materials, such as indium tin oxide (ITO), zinc oxide doped with aluminum, nickel chromium alloys, or the like, typically requiring a deposition temperature of nearly 350° C. Over the adhesion coating 14 there is deposited a conductive layer 16 of a material which bonds to coating 14 and which has good wettability to tin-lead solder. Layer 16, therefore, can comprise copper, silver, gold, or platinum, which provides contacts or conductors on substrate 12 for subsequently soldering other electrical conductors to the conductive layer 16 now positioned on substrate 12. Device 10 can be any number of optical or electrical devices, including photonic, and other fiber optic devices, semiconductor devices, LCD or other flat screen displays employing an array of such conductors for activating pixels forming a display or surface-mounted devices utilizing chip-on glass technology as examples. As noted above, coating 14 may itself comprise multiple layers of various alloys in an effort to improve the adhesion to the substrate as well as the adhesion of the conductive layer 16 to the coating 14. When multiple layers are provided with the multiple interface between such layers, the risk of failure increases and, as the layers become relatively thick, the internal stresses within the layers can themselves cause tearing and failure of the deposited conductor on the device.

Figure 2:
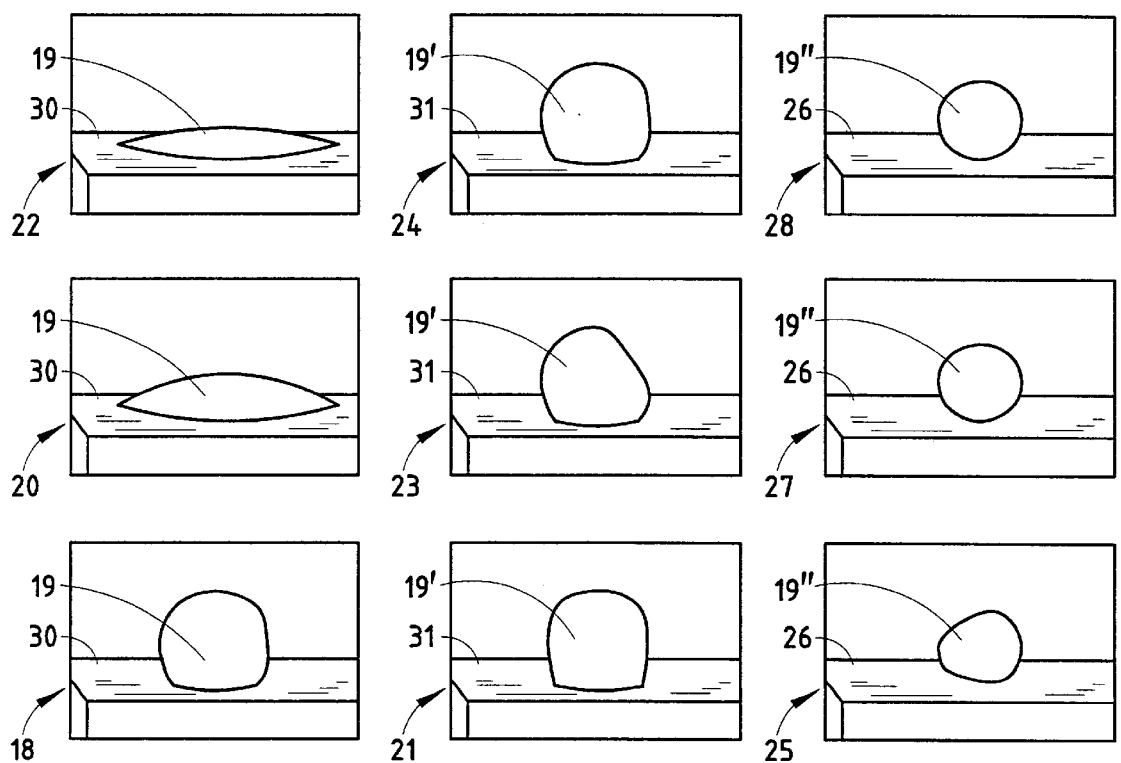
FIG. 2 is a series of drawings showing the wettability of the copper-gallium alloy of the present invention compared to a multi-layer copper ITO film and a chromium thin film.

It has been discovered that an alloy of copper-gallium deposited directly on a nonconductive substrate, such as fused silica, silicone dioxide, aluminum oxide, or any ceramic, glass, or polymeric substrate, provides surprising and unexpected wettability to solder and also excellent adhesion to such substrates. In referring to FIG. 2, there is shown a comparison of a copper-gallium ($Cu_4Ga$) alloy film 30 with a 20 percent on an atomic basis of gallium (shown in the left column) with copper 31 deposited over ITO on a substrate (center column) and a chromium layer 26 over a substrate (right-hand column) at three different temperatures, as the temperature is increased from 150° C. (blocks 18, 21 and 25) to approximately 210° C. (blocks 22, 24 and 28). In FIG. 2, block 18, a pellet 19 of tin-lead solder is shown as it begins melting. As the temperature is increased at block 20, the solder has reached a temperature of about 180° C. and begins to flow over the $Cu_4Ga$ surface 30 of a substrate 32. As the temperature is increased to 210° C. as shown in block 22, the solder has puddled and is wetted to cover a substantial surface area of the $Cu_4Ga$ alloy surface 30. In contrast, the copper layer over ITO surface 31 shown in block 21 at the same temperature as block 18 and successive blocks 23 and 24 illustrate that a solder pellet 19' begins melting as in the first column. It does not flow over the surface of the copper layer 31 during the heating process as well as even the intermediate block 20 shows for the $Cu_4Ga$ alloy of the present invention. In the third example at block 25, there is shown a pellet of solder 19" on a surface 26 of chromium over a nonconductive substrate, and, as the solder is heated from about 150° C. to about 210° C. through blocks 27 and 28, it is seen that the solder, in fact, does not wet at all with respect to the chromium surface and, in fact, tends to "ball up" and resist adhesion.

A film of Cu4Ga having a thickness of at least about 400 nanometers and up to about 3 microns was discovered to have had an adhesion to a fused silica substrate utilizing standard solder pull-off tests of from about 1.5 to about 2.8 $10^6$ newtons/meters$^2$ utilizing a Sn:Pb mixture of 60:40. Thus, not only is the wettability of the Cu4Ga thin film on a substrate greatly superior to even copper, the adhesion to a nonconductive substrate, such as fused silica, is equally unexpected and surprising.

Figure 3:
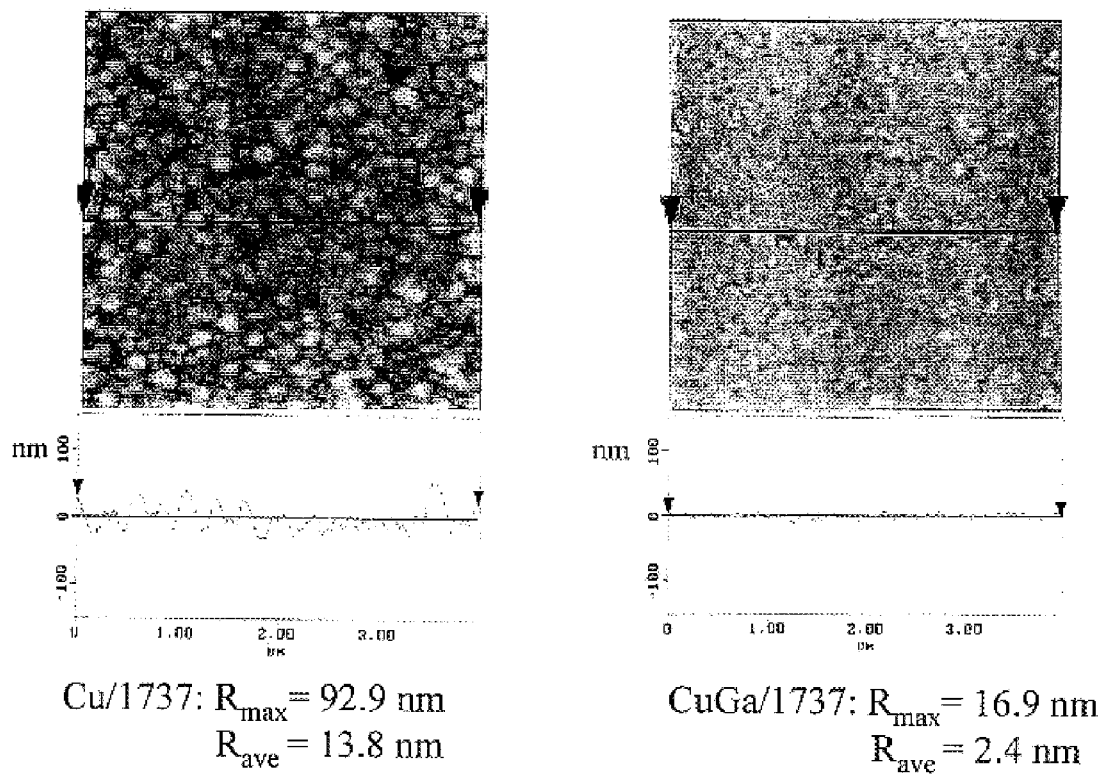
FIG. 3 is a photomicrograph of the surface morphology of a sputtered copper-gallium alloy as compared to a sputtered copper film.

A photomicrograph of the surface morphology of a copper-gallium film, such as Cu4Ga, as compared to a sputtered copper film is shown in FIG. 3, with the left column of FIG. 3 showing that the copper has a maximum surface variation depth of approximately 92.9 nanometers and average surface variation depth of 13.8 nanometers. The Cu4Ga photomicrograph is shown to the right in FIG. 3 and shows a much smaller maximum surface variation depth of 16.9 nanometers and average surface variation depth of 2.4 nanometers. Thus, the Cu4Ga film is nearly 14 times smoother than the copper film as measured by atomic force microscopy, as shown in the photomicrograph of FIG. 3.

Further, the resistivity of the copper film of FIG. 3 was approximately 1.7 to 2.1 micro ohms while the Cu4Ga film was less than 1.7 micro ohms. The adhesion strength of the copper film was relatively low, while its internal stress was high. The Cu4Ga film, on the other hand, had a high adhesion stress, as noted above, and no internal stress due to the ability to deposit the film at relatively low temperatures. Two methods of applying the copper-gallium alloys onto a substrate are now described in connection with FIGS. 4 and 5.

Figure 4:
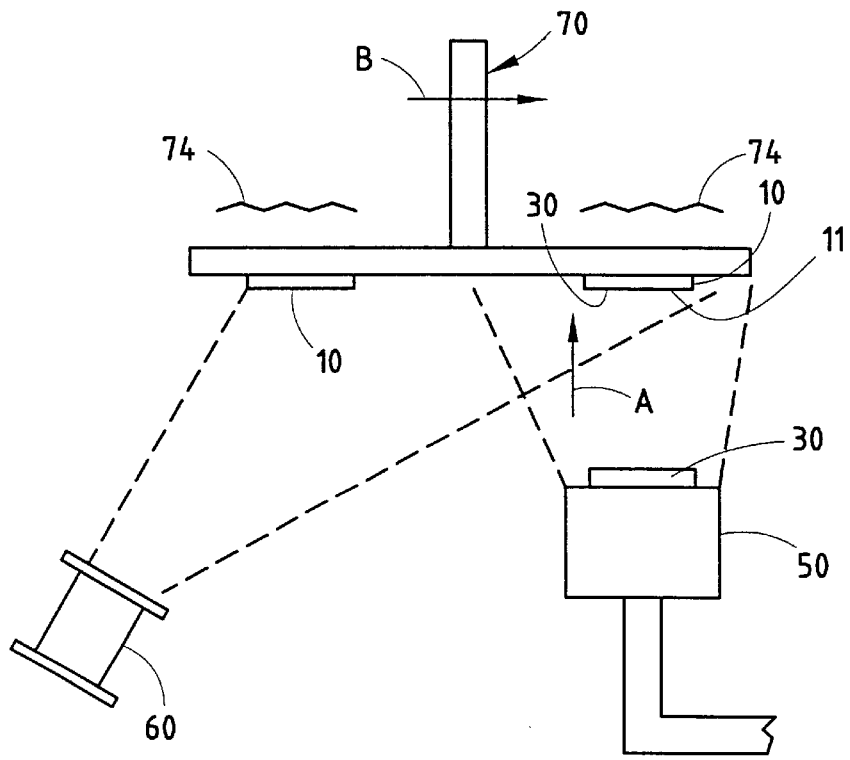
FIG. 4 is a schematic view of one apparatus illustrating one method of depositing copper-gallium film of the present invention.

In FIG. 4, there is shown a first method of depositing a film of from about 400 nanometers to about 3 microns of a Cu4Ga alloy onto a substrate. In FIG. 4, substrate 10 is shown and may be a substrate of any nonconductive material suitable for the manufacture of a fiber optic device, a photonic device, a semiconductor device, a flat screen display device, or other electrical component. Thus, substrate 10 may be fused silica, silicone dioxide, aluminum oxide or any other glass, ceramic or polymeric material. The entire apparatus shown in FIG. 2 is positioned in a vacuum chamber and is commercially available equipment with the copper-gallium material 30 formed as a disk placed as a target on a sputtering gun 50 of conventional construction for sputtering a vapor of copper-gallium molecules onto the substrate 10 in the direction illustrated by arrow A in FIG. 4. Adjacent and spaced from the sputtering gun 50 is an ion beam source 60 which employs an inert gas such as argon, helium, or xenon to bombard the same area of the substrate 10 with inert gas atoms to add momentum to the molecules of copper-gallium for not only cleaning the surface 11 of the substrate 10 but, more importantly, adding momentum to the copper-gallium molecules and to help reorganize the deposited material on the substrate.

By increasing the mobility of the copper-gallium molecules, the density of the film and the film adhesion is improved providing a strong chemical bond between the substrate 10 and the vacuum sputtered copper-gallium. Multiple substrates 10 can be mounted to a plate 72 of a carrier 70 translated in a direction indicated by arrow B to successively expose substrates for the deposition of the copper-gallium film thereon. The film coating process conventionally includes a mask, such that only desired areas of a given substrate are exposed to the application of the copper-gallium film.

Figure 5:
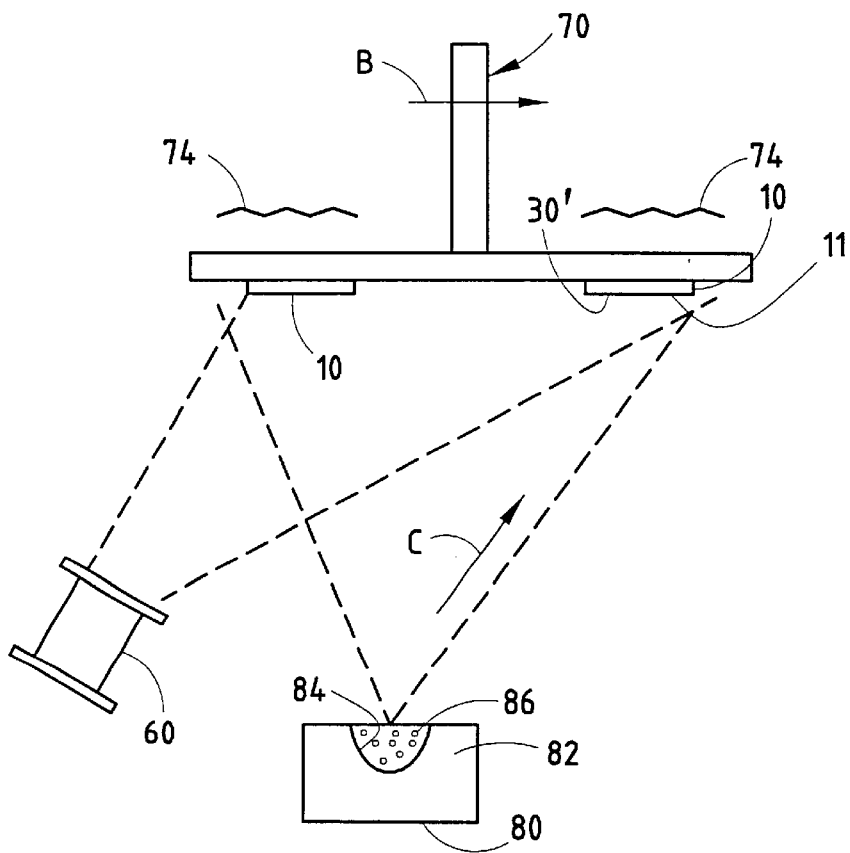
FIG. 5 is a schematic diagram of another apparatus illustrating an alternative method of depositing copper-gallium film of the present invention.

In addition to the vacuum sputtering method illustrated in FIG. 4, other methods of applying the copper-gallium film to a substrate, such as shown in FIG. 5, may be employed. The FIG. 5 structure is substantially the same as that of FIG. 4, with the substitution of an electron-beam source 80 in place of the sputtering gun 50. The electron beam source directs a beam of electrons onto copper-gallium alloy particles 86 which are placed in a crucible 84 held by a water-cooled block 82. The vaporized copper-gallium travels in a direction indicated by arrow C toward the substrate 10 to be coated. Oiptionally again, an ion beam source 60 may also be employed to assist in the coating process. The ion beam source has been helpful in improving the film coating, however, in some applications it may not be necessary and conventional sputtering and coating processes may be used without an ion beam source. The methods illustrated in FIGS. 4 and 5 can be conducted at room temperature (20° C.). If desired, in some applications where high speed deposition is desired, heaters, such as heaters 74, may be employed to heat the substrate(s) 10 to temperatures of up to about 300° C. where the devices formed on the substrate(s) will tolerate such temperatures. The heating also tends to improve adhesion of the deposited coating. In addition to the Cu4Ga alloy examples shown above in FIGS. 2 and 3, other molecular members of the copper-gallium family, such as CuGa2 and Cu9Ga4 or combinations thereof, may be employed as the deposited thin film material.

Figure 6:
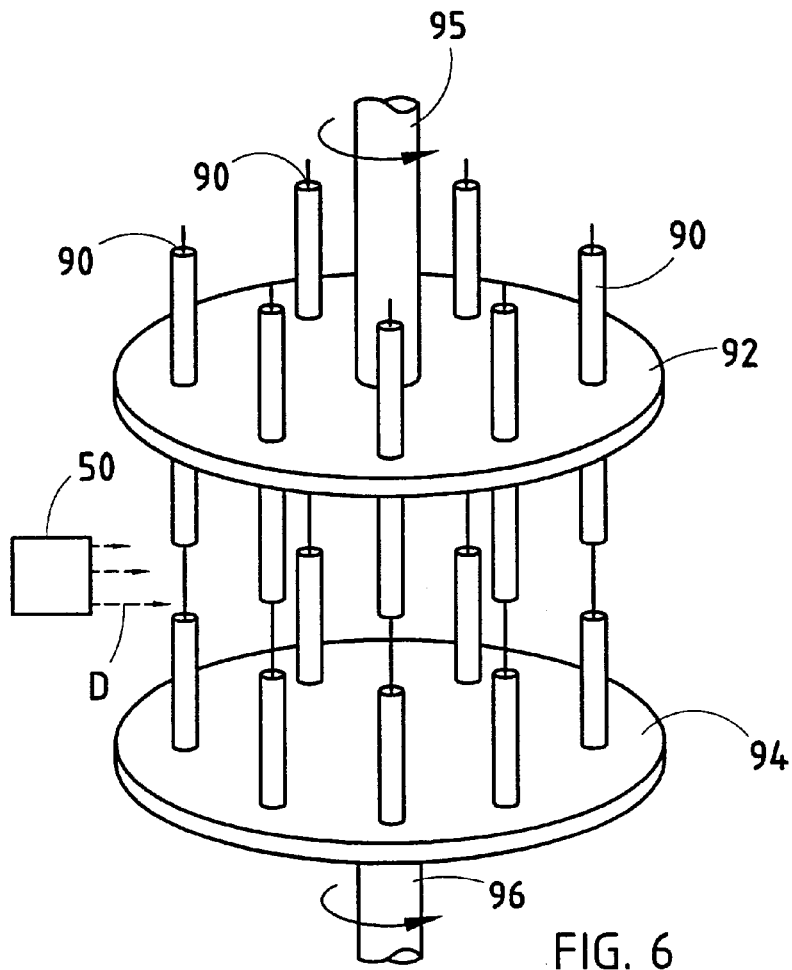
FIG. 6 is a fragmentary, schematic view of an apparatus employed for manufacturing a plurality of optical devices to which copper-gallium thin film is deposited.

Referring now to FIG. 6, a structure is shown in schematic form which may be used for selectively coating areas of optical fibers held in hollow cylindrical masking and support tubes 90 extending through spaced-apart apertures in an upper plate 92 and a lower plate 94. Plates 92 and 94 are coupled to vertical axles 95 and 96, respectively, for rotating the tubes 90 and optical fibers 100 supported therein around a sputtering gun, such as gun 50, which accelerates molecules of copper-gallium alloy toward the fibers 100 in a direction indicated by arrow D in FIG. 6. An ion gun source, such as shown at 60 in FIGS. 4 and 5, may also be employed to improve the sputter coating of copper-gallium film onto an area of each of the fibers 100. The tubes 90 can selectively expose only the area of the optical fibers desired to be coated. The plates 92 and 94 have a plurality of tubes 90 therein for manufacturing production quantities of coated fibers.

Figure 7:
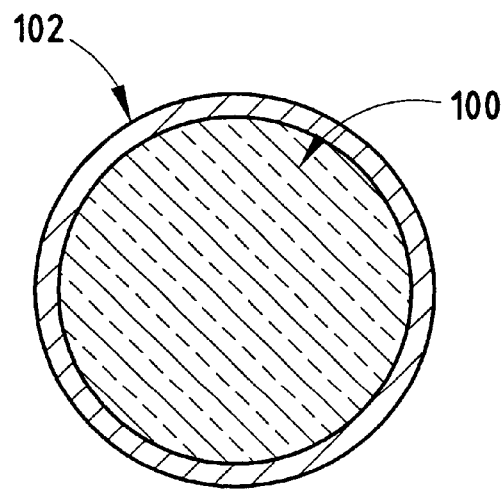
FIG. 7 is a greatly enlarged cross-sectional view of an optical fiber with a thin film coating of copper-gallium alloy according to the present invention.

FIG. 7 shows the resultant uniform coating of a fiber 100 having a fused silica core with a dopant for increasing the refractive index and an outer cladding. The exterior surface of the fiber has a uniform film coating 102 of copper-gallium alloy with a thickness of from about 400 nanometers to about 3 microns, which uniformly circumscribes the cylindrical outer surface of the optical fiber in an area unmasked by tubes 90 in the FIG. 6 apparatus.

Thus, the FIGS. 4 and 5 structure is particularly useful in coating planar glass, ceramic, or polymeric surfaces used for electrical components and flat-screen displays. The structure of FIG. 6 is particularly useful in coating optical fibers for providing an electrical conductive path to such fibers for connection to, for example, resistive heaters employed to tune fiber Bragg gratings contained within the optical fibers. Not only is copper-gallium useful to provide a solderable electrical connection to optical fibers and glass, ceramic, and polymeric substrates, it is also useful for sealing of a package. Both applications are now described with reference to FIG. 8.

In FIG. 8, there is shown a packaged tunable fiber Bragg grating 110 which includes an optical fiber 112 with a grating 114 formed therein. A thin film resistor 116 is deposited on the optical fiber 112 and solderable thin film copper-gallium contacts 118, 120 are formed circumferentially around the fiber at opposite ends of the grating 114 and provide electrical contact with the thin film resistor 116. The method disclosed in FIG. 6 and the resultant structure in FIG. 7 can be employed for providing film coatings 118, 120 such that electrical conductors 121 and 122 can be soldered directly to the contacts 118, 120 for heating the fiber Bragg grating 114, thereby changing its center frequency.

The grating 114 and the optical fiber 112 in which it is formed is encased in a cylindrical glass tube 130. The annular space 136 between cylindrical tube 130 and grating 114 is filled with an inert gas at sub-atmospheric pressures and hermetically sealed with a solder seal 140 and 142 on opposite ends of the cylindrical tube 130. The solder seals 140, 142 bond to two solderable thin film copper-gallium coatings 150 and 152 formed on the exterior ends of the cylindrical glass tube 130 and provide the electrical contact between the copper-gallium contacts 118, 120 and conductors 121, 122 for providing a hermetically sealed chamber for the Bragg grating so packaged. The opposite ends of the sealed package are capped with epoxy or polymeric caps 132, 134. Thus, the solderable thin film copper-gallium material can, in addition to providing an electrical contact to which electrical conductors can be soldered, provide either independently or jointly a structure for sealing a fiber optic component, such as a fiber Bragg grating package 110 shown in FIG. 8.

Many fiber optic components employed in communications systems are encased in gold-plated metal containers, which can also be hermetically sealed by providing an annular thin film copper-gallium coating on the input and output optical fibers. Solder is applied to the thin film coating and the container for sealing the container-fiber interface. Such an application is shown in FIG. 9 where a fiber optic component 160 is shown and is encased in a generally rectangular metal container 162, typically plated with gold for providing an environmentally stable housing for the fiber optic components therein. An input optical fiber 164 and an output optical fiber 166 each include a thin annular sleeve 165 of copper-gallium deposited according to the methods of the present invention to which solder 168 is subsequently applied, providing a seal between the outer surface 161 of the opposite ends of container 162 and the optical fibers 164 and 166. A suitable flexible polymeric boot (not shown) is then applied over the cable and solder connection 168 to provide strain relief and a final product package. The copper-gallium sleeves 165, however, provide the ability to hermetically seal the container 162 utilizing solder 168 at the interface between the aperture through which fibers 164 and 166 extend and the metal container.

It will become apparent to those skilled in the art that various other applications and modifications to the preferred embodiments of the invention as described herein can be made by those skilled in the art without departing from the spirit or scope of the invention as defined by the appended claims.

The invention claimed is:

1. A method of providing a solderable thin film coating on a nonconductive substrate comprising the steps of:

providing a substrate of nonconductive material to be coated; and coating said substrate with a layer of copper-gallium alloy, wherein said copper-gallium alloy comprises from about 1 percent to about 40 percent gallium and from about 99 percent to about 60 percent copper on an atomic basis.

2. The method as defined in claim 1 wherein said coating step comprises coating said substrate with copper-gallium alloy to a thickness of from about 400 nanometers to about 3 microns.

3. The method as defined in claim 1 wherein said coating step comprises vacuum sputtering copper-gallium alloy onto said substrate.

4. The method as defined in claim 3 wherein said coating step includes providing an ion beam source of inert gas directed toward said substrate for accelerating copper-gallium molecules toward said substrate.

5. The method as defined in claim 1 wherein said coating step comprises an electron beam coating of copper-gallium alloy onto said substrate.

6. The method as defined in claim 5 wherein said coating step includes providing an ion beam source of inert gas directed toward said substrate for accelerating copper-gallium molecules toward said substrate.

7. An electrical component comprising:

a nonconductive substrate; and at least one thin film electrical conductor formed thereon comprising a coating of copper-gallium alloy, wherein said copper-gallium alloy comprises from about 1 percent to about 40 percent gallium and from about 99 percent to about 60 percent copper on an atomic basis.

8. A component as defined in claim 7 wherein said substrate is made of glass.

9. A component as defined in claim 7 wherein the thickness of the copper-gallium alloy coating is from about 400 nanometers to about 3 microns.

10. A fiber optic component comprising:

a nonconductive substrate; and at least one thin film electrical conductor formed thereon comprising a coating of copper-gallium alloy, wherein said copper-gallium alloy comprises from about 1 percent to about 40 percent gallium and from about 99 percent to about 60 percent copper on an atomic basis.

11. A component as defined in claim 10 wherein said substrate is an optical fiber.

12. A component as defined in claim 10 wherein the thickness of the copper-gallium alloy coating is from about 400 nanometers to about 3 microns.

13. A package for an optical fiber component comprising:

an optical fiber having a sleeve of copper-gallium film deposited thereon;

an enclosure for said fiber, said enclosure comprising a glass or ceramic material having an opening through which said fiber extends;

a thin film coating of copper-gallium surrounding said opening of said enclosure through which said optical fiber extends in alignment with said sleeve; and a solder sealed between said sleeve and said coating of said enclosure, wherein each of said copper-gallium films is an alloy comprising from about 1 percent to about 40 percent gallium and from about 99 percent to about 60 percent copper on an atomic basis.

14. The package as defined in claim 13 wherein said copper-gallium alloy has a thickness of from about 400 nanometers to about 3 microns.

15. The package as defined in claim 13 wherein said enclosure is a cylindrical member with a copper-gallium coating at opposite ends and said optical fiber defines a tunable fiber Bragg grating having a copper-gallium sleeve at opposite ends electrically coupled to a thin film resistor and said solder seal is provided at opposite ends of said enclosure.

16. The package as defined in claim 15 and further including electrical conductors coupled to said solder seal for applying power to said thin film resistor.

17. A package for an optical fiber component comprising:

a metallic housing including at least one aperture for receiving an optical fiber therein;

at least one optical fiber extending into said housing through said aperture;

a copper-gallium sleeve deposited on said optical fiber at the interface between said fiber and said aperture in said metallic housing; and solder joining said copper-gallium sleeve of said optical fiber to said metallic housing, thereby sealing the interface between said optical fiber and said housing at the aperture, wherein said copper-gallium sleeve is a copper-gallium alloy comprising from about 1 percent to about 40 percent gallium and from about 99 percent to about 60 percent copper on an atomic basis.

18. The package as defined in claim 17 wherein said copper-gallium alloy has a thickness of from about 400 nanometers to about 3 microns.

* * * * *